United States Patent [19]
Harder et al.

[11] Patent Number: 5,617,628
[45] Date of Patent: Apr. 8, 1997

[54] INTEGRATED CIRCUIT EXTRACTION TOOL

[75] Inventors: Stanley D. Harder, Richardson; Thomas D. Selgas, Jr., Garland, both of Tex.

[73] Assignee: Cyrix Corporation, Richardson, Tex.

[21] Appl. No.: 357,482

[22] Filed: Dec. 16, 1994

Related U.S. Application Data

[63] Continuation-in-part of Ser. No. 63,134, May 17, 1993, Pat. No. 5,440,803.

[51] Int. Cl.⁶ ..................................... H05K 13/00
[52] U.S. Cl. ..................... 29/764; 29/267; 254/120; 254/131
[58] Field of Search ................ 29/764, 758, 267; 254/120, 131, 21, 25, 27, 28

[56] References Cited

U.S. PATENT DOCUMENTS

| | | | |
|---|---|---|---|
| 1,486,820 | 3/1924 | Wilder | 254/25 |
| 2,457,231 | 12/1948 | Henderson | 254/25 |
| 3,559,267 | 2/1971 | Castellani . | |
| 4,141,138 | 2/1979 | Quick . | |
| 4,519,130 | 5/1985 | Schaefer . | |
| 4,756,078 | 7/1988 | Dougherty . | |
| 4,852,925 | 8/1989 | Lodin . | |
| 4,970,779 | 11/1990 | Chen . | |

FOREIGN PATENT DOCUMENTS 62-52947  7/1987  Japan .

OTHER PUBLICATIONS

Information Sheets entitled "PGA Sockets", AMP Incorporated, Product Information Center, pp. 94–95.

*Primary Examiner*—Carl E. Hall
*Attorney, Agent, or Firm*—Andrew S. Viger; John L. Maxin

[57] ABSTRACT

An integrated circuit extraction tool for extracting sockets or microprocessors having a staggered pin grid array (SPGA) pin arrangement. Such tool includes an elongated base having a first end and a second end, each end forming a set of teeth that permit entry and extension of the teeth, diagonally, through the staggered pins of the socket or microprocessor. In the preferred embodiment, the first end is disposed at ninety degree with respect to the elongated base. Further, the elongated base is formed with a curvature to enhance the leverage action necessary for an extraction operation.

5 Claims, 4 Drawing Sheets

5,617,628

1

INTEGRATED CIRCUIT EXTRACTION TOOL

CROSS-REFERENCE TO RELATED APPLICATIONS

This application is a continuation-in-part of U.S. application Ser. No. 08/063,134, now U.S. Pat. No. 5,440,803 entitled "Integrated Circuit Extraction Tool" filed on May 17, 1993 and assigned to the assignee of the present invention.

BACKGROUND OF THE INVENTION

1. Field of the Invention

The invention relates generally to devices for removing integrated circuits from their respective sockets, and more particularly to an integrated circuit extracting tool for extracting staggered pin grid array (SPGA) packages from their respective sockets.

2. Description of Related Art

In designing an electronic device, sockets are often provided on the integrated circuit board for receiving integrated circuits; alternatively, such integrated circuits, such as microprocessors and coprocessors, may be directly soldered to the integrated circuit board. While it is less expensive to directly solder an integrated circuit to an integrated circuit board, consumers have shown a willingness to accept additional cost for the use of sockets, in exchange for the benefits socketed integrated circuits offer—the ability to easily replace or upgrade the received integrated circuit without the labor-intensive and potentially damaging process of removing a similarly soldered devices.

Apart from replacement of defective parts, upgrading a system microprocessor is becoming increasingly popular and is considered an important feature by many users. By replacing older technology, such as the INTEL® 80386, with a newer, compatible technology, the useful life of a computer system may be extended by several years. The growing popularity of upgrading systems is directly related to the savings in cost associated with the replacement of a single integrated circuit, rather than replacement of an entire motherboard or purchasing a new system. Accordingly, the user's investments in other peripheral devices, such as video cards, modems, disk drives, serial ports and floppy drives, which are easily transferred to an upgraded system, is also protected.

Most removable processors are designed to fit a pin grid array (PGA) socket. Notwithstanding, with the growing use of Pentium™-class microprocessors, which utilize a staggered pin grid array (SPGA) package, future replacement or upgrade products will depend and also utilize SPGA packages or sockets.

A PGA socket 10 is shown in FIG. 1a (top view) and FIG. 1b (side view). In contrast, a SPGA socket 20 is shown in FIG. 2a (top view) and FIG. 2b (side view). The SPGA socket 20 comprises a staggered grid of receptacles 22, each receptacle 22 being encased in a conductive metal which extends through to connectors 24. The connectors 24 include a base portion 26 and pin portion 28.

FIG. 2c illustrates a side view of a typical arrangement where a first socket 30 is soldered into a printed circuit board 32. A second socket 20 is inserted into the first socket 30, such that it may be removed at a later time. A double-socket arrangement may be used, for example, where socket 20 provides decoupling capacitors or other components, or in order to protect the pins of an integrated circuit 36.

The integrated circuit 36, for example, a microprocessor, is inserted into the second socket 20. The integrated circuit 36 has pins 38 which correspond to the receptacles 22 of socket 20; however, the pins 38 of the integrated circuit 36 typically do not have base portions, i.e., reference the base portions 26 of socket 20. Further, the pins 38 of the integrated circuit 36 are typically fabricated from a highly conductive material which may be more malleable than the conductors 24 of socket 20.

Prior art extraction tools that use "teeth" to engage the pins of the microprocessor or socket, are dependent upon conventional, rectangular pin grid arrangements, e.g., PGA packages. In contrast, non-rectangular pin arrangements, e.g., SPGA packages, do not permit prior art extraction tools to properly engage the teeth or extend beneath the microprocessor or socket to minimize the potential damage to the device or socket being removed.

Further, removal of a microprocessor from a computer system is sometimes difficult due to the number of devices in the computer cabinet. Generally, it is undesirable to remove the motherboard from the cabinet prior to removal of the microprocessor from the motherboard due to an increased likelihood of damage to either the motherboard or the components thereon. A number of devices have been designed for removal of the microprocessor from the socket; however, when used as intended, these prior art devices require clearance on all four sides as well as the top of the microprocessor. Therefore, a tool demanding such access to the device being removed is not well suited for many of today's low profile systems.

Further, prior art extraction tools often require the use of a single upward force, applied directly to the microprocessor package, to disengage the microprocessor from its mated socket. Consequently, the slightest deviation from a uniform force distribution across the microprocessor package, caused by any force applied to the package that is not normal to the device being removed, can cause bending of the device's pins or other damage to the package.

Further, prior art extraction tools for integrated circuits often interface with package edges that are devoid of pins or edges having a significant contact area between the package edge and the pins—an SPGA package provides for neither. Therefore, such prior art extraction tools would be ineffective in the removal of an SPGA device or socket.

Therefore, a need has arisen in the industry for a integrated extraction tool which allows for easy and safe removal of an SPGA integrated circuit from a motherboard.

SUMMARY OF THE INVENTION

To overcome the limitations in the prior art described above, and to overcome other limitations that will become apparent upon reading and understanding the present specification, the present invention discloses an integrated circuit extraction tool for removing devices or sockets having a staggered pin arrangement from an integrated circuit board. The tool has a first and a second member, each member having an elongated base ending in a first end and a second end. The first end of each member is substantially at a right angle to the elongated base and further forms a set of teeth, to enter between and engage a plurality of pins of a staggered pin grid array (SPGA) package, disposed at substantially 45° degrees relative to a longitudinal axis of the member. Each member is engaged on opposite sides of the device to be removed. Further, as the members are drawn toward each other by an application of an inward normal force to the second portion of each member, the inwardly directed forces are translated to lifting forces that disengage the device from its mating socket.

A feature of the present invention is pin-engaging teeth that permit the entry between the pins of and the extension beneath a device having a SPGA package configuration.

Another feature of the present invention is two independent force generating members, acting on opposite sides of the device to be removed, to permit extraction at a controlled rate, reducing the potential for damage to the pins or package of the device being removed.

Yet another feature of the present invention is that it permits the extraction of devices from areas having restricted access.

These and various other objects, features, and advantages of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described specific examples of a integrated circuit extraction tool in accordance with the present invention.

BRIEF DESCRIPTION OF THE DRAWINGS

Referring now to the drawings in which like reference numerals and letters indicate corresponding elements throughout the several views:

FIG. 3b illustrates a side view of the extraction tool of FIG. 3a;

FIG. 3c illustrates a top view of the extraction tool of FIG. 3a;

DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1A:
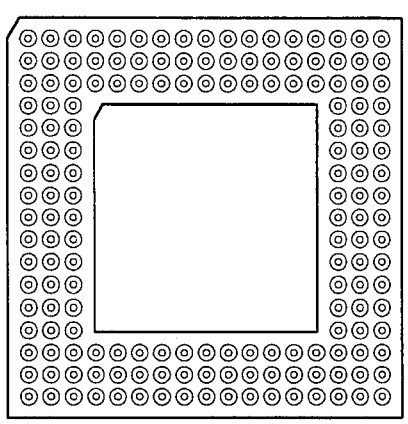
FIG. 1a illustrates a top view of a pin grid array (PGA) socket.
Figure 1B:
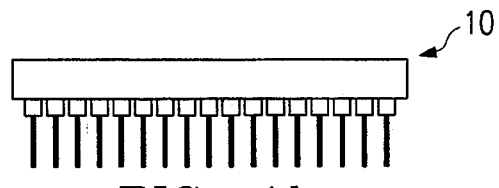
FIG. 1b illustrates a side view of a PGA socket.
Figure 2A:
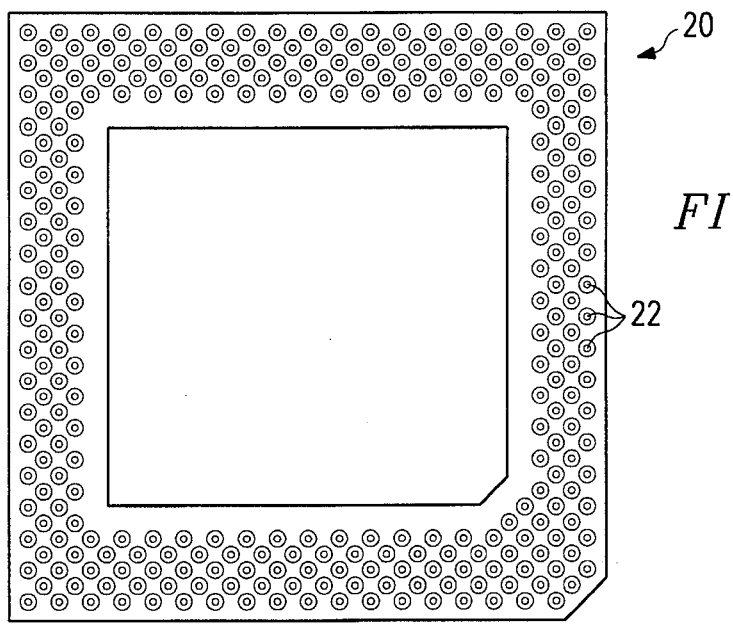
FIG. 2a illustrates a top view of a staggered pin grid array (SPGA) socket.
Figure 2B:
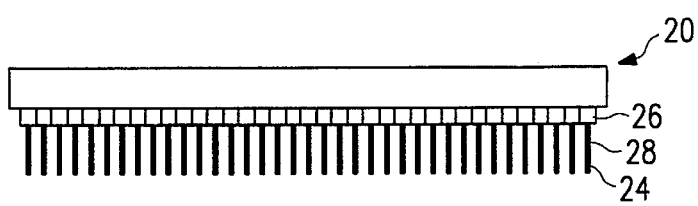
FIG. 2b illustrates a side view of a SPGA socket.
Figure 2C:
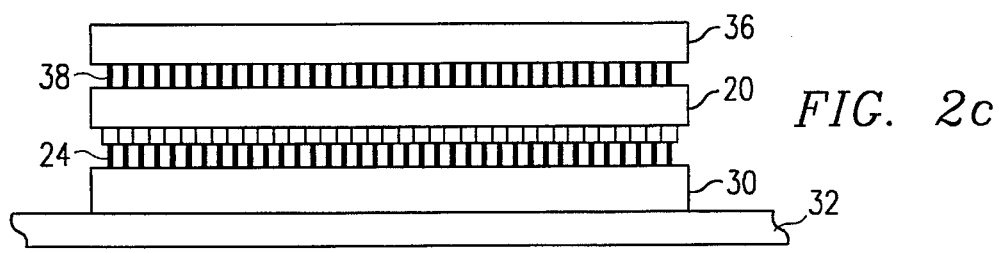
FIG. 2c illustrates a side view of a integrated circuit disposed in a SPGA socket and coupled to a printed circuit board.
Figure 3A:
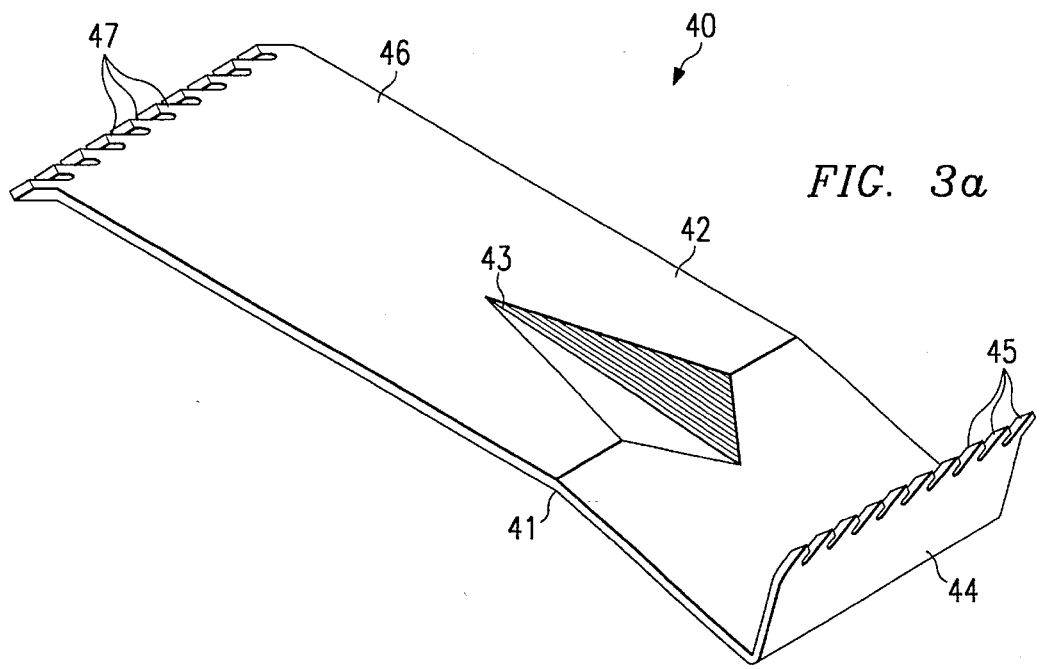
FIG. 3a illustrates a perspective view of an integrated circuit extraction tool.

FIG. 3a illustrates a perspective view of the integrated circuit extraction tool of the present invention. The extraction tool 40 includes a base portion 42 terminating in first and second end portions 44, 46, respectively. The first portion 44 is angled from the main base portion 42 by a angle of substantially 90 degrees. A first set of teeth 45 are formed in the first end portion 44 and a second set of teeth 47 are formed in the second end portion 46. The base portion 42 includes a curvature in the form of a bend 41. In the preferred embodiment, the bend 41 is approximately fifteen degrees, although a greater bend, or even no bend, may be used. A gusset 43 is formed in the base portion to add strength to the extraction tool 40. In the preferred embodiment, the extraction tool 40 is formed from a metal material, i.e., steel; however, other materials could be used as well, so long as they have sufficient strength.

Figure 3B:
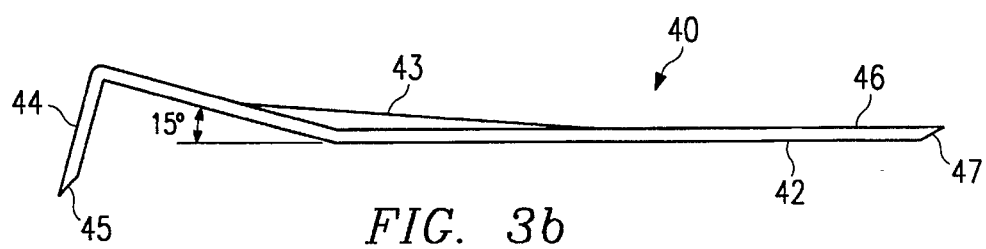
Figure 3C:
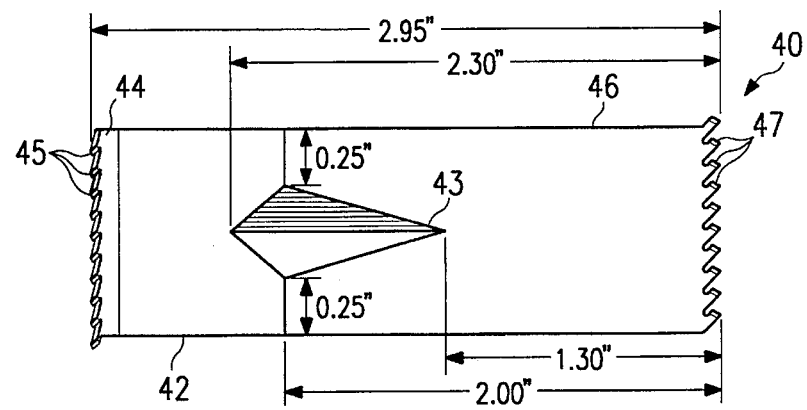

FIGS. 3b–c illustrate top and side views of the extraction tool 40 with dimensions for a preferred embodiment for use with a SPGA package. As shown in FIG. 3b, the \teeth 45 and 47 terminate in chisel points to facilitate insertion of the tool between the article to be extracted and a socket or printed circuit board.

Figure 4A:
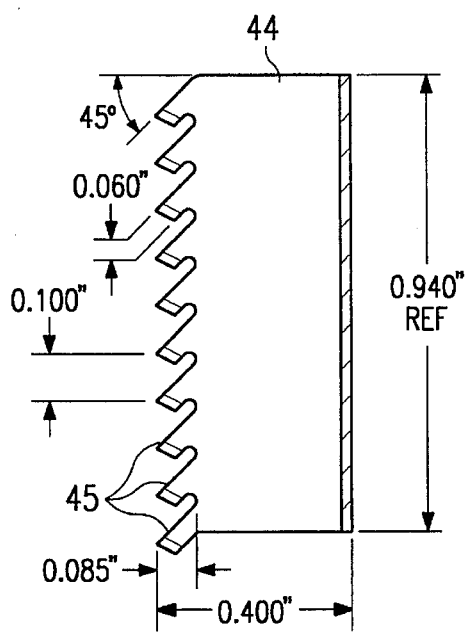
FIGS. 4a–b illustrate the first and second teeth portions of the extraction tool.
Figure 4B:
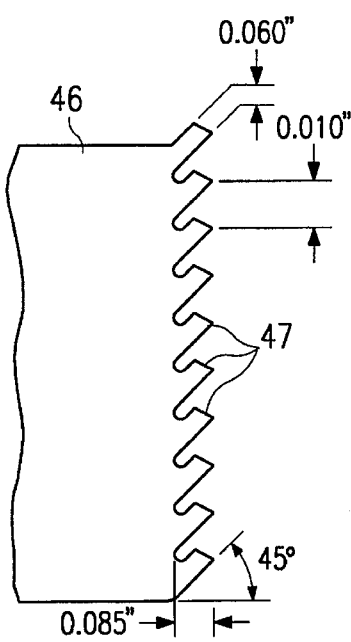

The first and second sets of teeth are shown in greater detail in connection with FIG. 4a and FIG. 4b, respectively. As can be seen in FIG. 4a, the first set of teeth 45 are disposed at a 45° angle with respect to a longitudinal axis of the member. This angular displacement permits the teeth to enter between the staggered pins and extend beneath a device incorporating a SPGA configuration. Measuring from tooth to tooth, a tooth-spacing length is 0.100", corresponding to the spacing center of the staggered pins 24, 38. The teeth have a width of 0.060", corresponding to a diagonal distance between staggered pins 24, 38.

For the second set of teeth 47, shown in FIG. 4b, the teeth are at a 45° angle with respect to the longitudinal axis of the member. Like the angular displacement of teeth 45, this permits the second set of teeth to enter between the staggered pins of a SPGA package. In the preferred embodiment, the second set of teeth 47 are formed to the dimensions of the first set of teeth 45. It should be appreciated that the angular displacement of the teeth 45, 47 does not preclude the tool's use with rectangular pin configurations, e.g., PGA packages.

For reference, a SPGA package configuration utilizes 0.018" diameter pins having rows of pins with 0.100" spaced centers, wherein each successive row is a distance of and staggered 0.050" from the preceding row. The dimensions of the tool 40 could be adjusted to any size spacing desired for other package types.

Figure 5A:
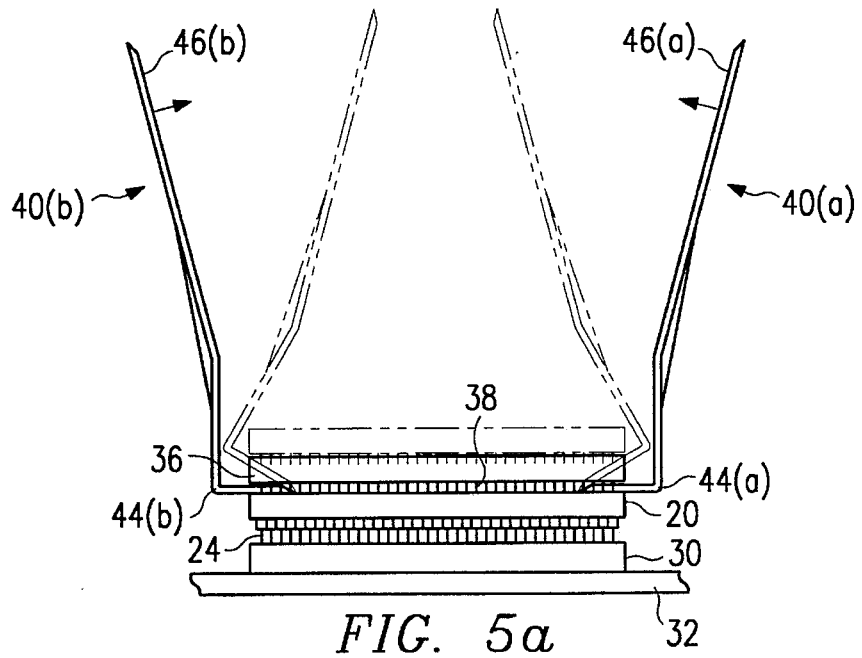
FIGS. 5a–c illustrates the extraction tool as used to remove an integrated circuit from a socket.

FIG. 5a illustrates a method of removal of a SPGA microprocessor from a mated SPGA socket. In this case, two tools 40(a), 40(b) are used on opposite sides of the integrated circuit 36. Particularly, the first set of teeth 45 of each tool are interposed between the microprocessor 36 and the mated socket 20. Once the first set of teeth 45 of each member are properly engaged (i.e., the teeth 45 extending diagonally through at least the first rows of pins 38), the second end portions 46(a), 46(b) may be pulled together by applying inwardly directed forces to the second portions 46(a), 46(b), wherein such forces are normal to the base portions 42 of each tool 40(a), 40(b). If it is observed that one side of the microprocessor 36 is being extracted at a faster rate than the other, potentially resulting in damage to the pins 38, corrective measures in the form of increasing or decreasing the independent applied forces to the members 40(a), 40(b) may be performed.

The bend 41 allows a increased lever arm to remove the microprocessor 36 before the two tools 40(a), 40(b) meet. Once the pins 38 disengage from the receptacles 22 of the socket 20, the microprocessor 36 and tools 40(a), 40(b) may be lifted clear of the computer housing (not shown) to complete the extraction operation.

The use of two independent members 40(a), 40(b) permits two independent, indirect lifting forces to be applied to the microprocessor package 36. As a consequence, the applied forces are exerted against the socket 20, via the leverage action, rather than the fragile microprocessor package 36. Moreover, two independent forces, positioned at opposite sides of the microprocessor package 36, permit a more controlled extraction operation, reducing the potential for bending the microprocessor pins 28 or damaging the fragile microprocessor package 36 during the extraction operation.

Figure 5B:
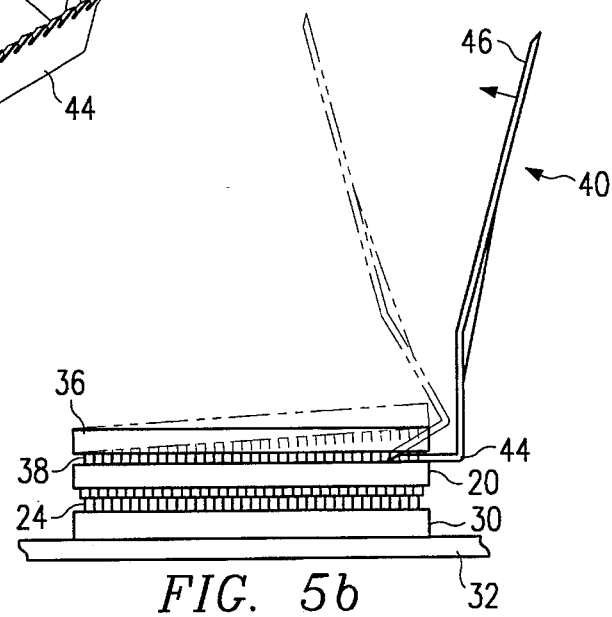

FIG. 5b illustrates another use of the extraction tool 40 to remove a microprocessor 36 from a socket 20. The extraction tool 40 has its first portion 44 interposed between the microprocessor 36 and the socket 20 such that the teeth 45 extend diagonally between the staggered pins 38. Similar to above, the second end 46 is pushed forward as a lever arm to provide a force to separate the microprocessor 36 from the socket 20. After providing an initial separation, the extraction tool may be used on the remaining three sides of the microprocessor 36 to provide separation. Generally, a single lever action on each side of the microprocessor 36 is sufficient to allow hand removal of the microprocessor 36 from the socket 20. Wherein the first end 44 is angled at approximately 90° from the base portion 42 and the bend 41 provide for an increased lever action, the extraction tool 40 requires very little clearance from adjacent devices.

Yet another use of the extraction tool 40 is to remove a socket 20 from a socket 30. In this case, the second end 46 of the extraction tool is placed between the first socket 20 and the second socket 30. An upwards lever action of the extraction tool 40 will separate the two sockets 20 and 30.

Figure 5C:
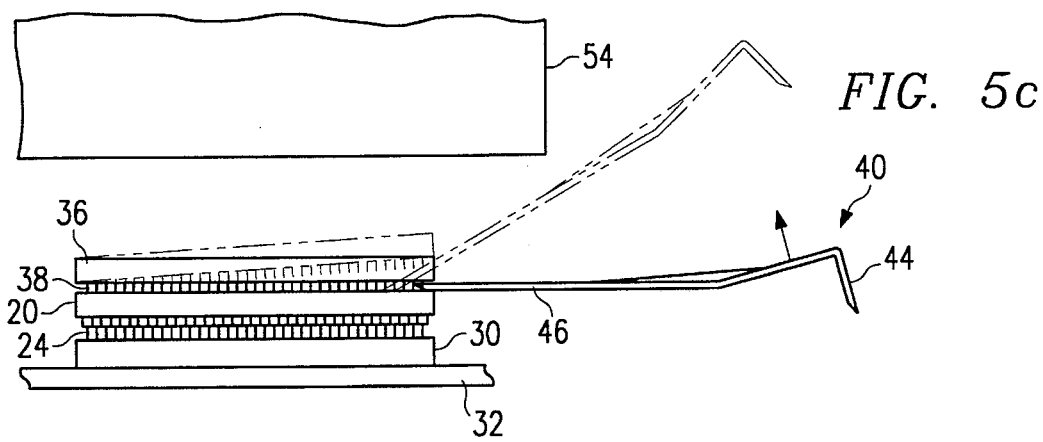

Further, as illustrated in FIG. 5c, the second end 46 may be used where a microprocessor is located below an obstruction, such as a drive bay 54. When using the second end 46 to remove a microprocessor 36 or socket 20, the extraction tool is relatively flat and can easily reach beneath an obstruction having less than one inch of clearance with the top of the microprocessor or socket. The fifteen degree bend 41 allows for additional leverage to facilitate removal of the microprocessor 36 or socket 20.

Figure 6:
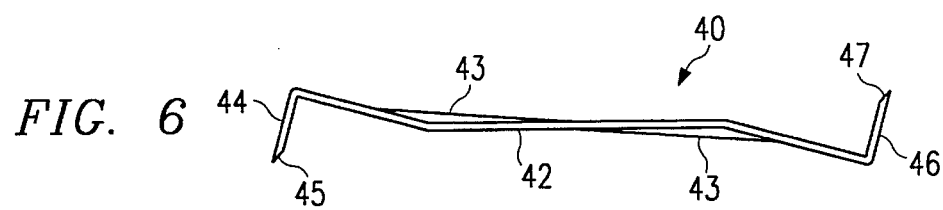
FIG. 6 illustrates a second embodiment of the extraction tool of the present invention.

FIG. 6 illustrates a second embodiment of the present invention where both the first and second ends 44 and 46 of the extraction tool 40 are angled at right angles with respect to the main base portion 42 to allow both integrated circuits and sockets to be removed in instances where clearance in minimal.

Figure 7:
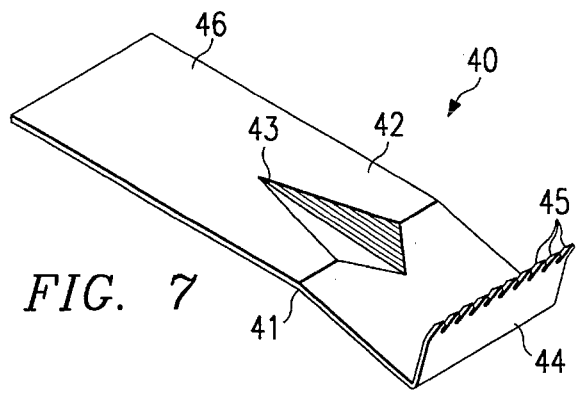
FIG. 7 illustrates a third embodiment of the extraction tool of the present invention.

FIG. 7 illustrates a third embodiment of the present invention where the second end 46 is formed without teeth.

The present invention provides significant advantages over the prior art. The teeth utilized by the extraction tool permit the engagement of a staggered pin arrangement. Using two, independent extraction tools permits an integrated circuit to be easily removed using one hand in one action with minimal potential for damage to the microprocessor or socket being extracted. A single tool is useful for a variety of computer configurations, wherein it is not known in advance whether the integrated circuit to be removed will have obstructions either on the side of the integrated circuit or over the integrated circuit.

Although the Detailed Description of the invention has been directed to certain exemplary embodiments, various modifications of these embodiments, as well as alternative embodiments, will be suggested to those skilled in the art. The invention has general applicability to any virtual memory addressing system or method. The invention encompasses any modifications or alternative embodiments that fall within the scope of the claims.

What is claimed is:

1. A tool for extracting an integrated circuit having a staggered pin grid array (SPGA) package from a corresponding socket, the SPGA package having at least two rows of pins arranged in a staggered pin grid array, comprising:

(a) a tool including a base portion angularly disposed to an engaging portion, the tool being adapted to engage the integrated circuit by inserting an end of the engaging portion between a lower surface of the integrated circuit and an upper surface of the socket for translating applied indirect forces on the base portion to direct lifting forces from the engaging portion substantially normal to the lower surface of the integrated circuit;

(b) the tool including engaging teeth formed in the end of the engaging portion at a predetermined teeth angle, the teeth angle being selected such that, when the tool is engaged, the engaging teeth are inserted past the at least two rows of pins arranged in a staggered configuration.

2. The tool of claim 1 wherein the teeth angle is substantially 45 degrees relative to a longitudinal axis of the engaging portion of the tool.

3. The tool of claim 1 wherein the engaging portion is disposed at 90 degrees relative to the base portion.

4. The tool of claim 3 further comprising a gusset formed on the base portion of the tool.

5. The tool of claim 1 further comprising a second set of engaging teeth formed in an end of the base portion at a predetermined teeth angle substantially the same as the teeth angle for the engaging teeth formed in the end of the engaging portion.

\* \* \* \* \*